US012628462B2

(12) United States Patent
Park

(10) Patent No.: US 12,628,462 B2
(45) Date of Patent: May 12, 2026

(54) IMAGE SENSOR PACKAGE

(71) Applicant: Samsung Electro-Mechanics Co., Ltd., Suwon-si (KR)

(72) Inventor: Eun Bae Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 850 days.

(21) Appl. No.: 17/949,279

(22) Filed: Sep. 21, 2022

(65) Prior Publication Data

US 2023/0207713 A1 Jun. 29, 2023

(30) Foreign Application Priority Data

Dec. 28, 2021 (KR) ........................ 10-2021-0189983

(51) Int. Cl.
*H10F 77/60* (2025.01)
(52) U.S. Cl.
CPC .................................... *H10F 77/60* (2025.01)
(58) Field of Classification Search
None
See application file for complete search history.

(56) References Cited

U.S. PATENT DOCUMENTS

| | | | | |
|---|---|---|---|---|
| 2009/0046184 A1* | 2/2009 | Ma | ........................ | H04N 23/54 |
| | | | | 348/294 |
| 2019/0072431 A1* | 3/2019 | Hirose | .................. | H10F 77/407 |
| 2020/0084875 A1 | 3/2020 | Umeda et al. | | |

| | | | | |
|---|---|---|---|---|
| 2020/0287062 A1* | 9/2020 | Yamamoto | ............ | H10F 39/804 |
| 2021/0313367 A1* | 10/2021 | Hatano | .................. | H10F 39/011 |
| 2022/0139979 A1* | 5/2022 | Watanabe | ............... | H01L 23/04 |
| | | | | 257/434 |
| 2022/0165641 A1* | 5/2022 | Nakayama | ............ | H10W 40/28 |

FOREIGN PATENT DOCUMENTS

| | | |
|---|---|---|
| JP | 8-107167 A | 4/1996 |
| JP | 2005-353867 A | 12/2005 |
| KR | 10-0822662 B1 | 4/2008 |
| KR | 10-2019-0096940 A | 8/2019 |
| KR | 10-2021-0035027 A | 3/2021 |

OTHER PUBLICATIONS

Korean Office Action issued on Apr. 27, 2023, in counterpart Korean Patent Application No. 10-2021-0189983 (8 pages in English, 6 pages in Korean).
Korean Office Action issued on Apr. 27, 2023, in counterpart Korean Patent Application No. 10-2023-0189983 (8 pages in English, 6 pages in Korean).

* cited by examiner

*Primary Examiner* — Benjamin P Sandvik
(74) *Attorney, Agent, or Firm* — NSIP Law

(57) ABSTRACT

An image sensor package is provided. The image sensor package includes an image sensor, a substrate on which the image sensor is disposed on a first surface of the substrate and a receiving groove is disposed in a second surface of the surface, and a heat dissipation element including a heat absorption portion configured to absorb heat from a contact surface and a heat emission portion configured to emit heat absorbed by the heat absorption portion, and coupled to the second surface of the substrate, wherein, in the heat dissipation element, at least a portion of the heat absorption portion is accommodated in the receiving groove and coupled to the substrate.

16 Claims, 7 Drawing Sheets

10

IMAGE SENSOR PACKAGE

CROSS-REFERENCE TO RELATED APPLICATIONS

This application claims the benefit under 35 USC § 119(a) of Korean Patent Application No. 10-2021-0189983, filed on Dec. 28, 2021, in the Korean Intellectual Property Office, the entire disclosure of which is incorporated herein by reference for all purposes.

BACKGROUND

1. Field

The following description relates to an image sensor package.

2. Description of Related Art

Camera modules may include an optical imaging system and an image sensor including one or more lenses. An optical imaging system may include one or more lenses having refractive power, and may allow light reflected from a subject to be focused on an image sensor. An image sensor may convert an optical signal refracted by an optical imaging system into an electrical signal.

Such camera modules may generate heat in an image sensor due to repeated imaging. Thus, it may be beneficial to implement camera modules which may effectively dissipate the heat of an image sensor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an image sensor package includes an image sensor; a substrate comprising the image sensor disposed on a first surface of the substrate, and a receiving groove disposed in a second surface of the substrate; and a heat dissipation element comprising a heat absorption portion configured to absorb heat dissipating from a contact surface, and a heat emission portion configured to emit heat absorbed by the heat absorption portion, wherein, in the heat dissipation element, at least a portion of the heat absorption portion is accommodated in the receiving groove and coupled to the substrate.

The heat dissipation element may be coupled to the second surface of the substrate.

The heat absorption portion may be disposed on a first surface of the heat dissipation element, and the heat emission portion is disposed on a second surface of the heat dissipation element, and the heat emission portion is entirely disposed externally of the receiving groove.

A bonding member may be interposed between the substrate and the heat absorption portion and configured to bond the substrate to the heat absorption portion.

The bonding member may be formed of a conductive material.

The bonding member may be disposed on an entire surface of the heat absorption portion.

A bonding member may be disposed along a side surface of the heat dissipation element externally of the receiving groove, and configured to bond the heat dissipation element to the substrate.

The bonding member may be disposed to cover an entire surface of the heat absorption portion exposed externally of the receiving groove.

The bonding member may be formed of an adhesive including an epoxy resin.

The bonding member may be configured to seal an internal space of the receiving groove.

The image sensor package may include a thermally conductive material that is filled in an internal space of the receiving groove.

At least a portion of the receiving groove may be formed in a region opposing the image sensor.

A shortest distance between the image sensor and the heat dissipation element may be disposed to be shorter than a thickness of the substrate.

An entire side surface of the heat absorption portion may be bonded to an internal surface of the receiving groove.

In a general aspect, an image sensor package includes a substrate including an image sensor disposed on a first surface of the substrate and a receiving groove disposed in a second surface of the substrate; a heat dissipation element inserted into the receiving groove; and a bonding member configured to bond the heat dissipation element to the substrate, wherein the heat dissipation element includes a heat absorption portion configured to absorb heat from a contact surface, and a heat emission portion configured to emit heat absorbed by the heat absorption portion, and wherein contact between the heat absorption portion and air is blocked by the bonding member.

The bonding member may be filled in an internal space of the receiving groove.

The bonding member may be configured to seal an internal space of the receiving groove.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
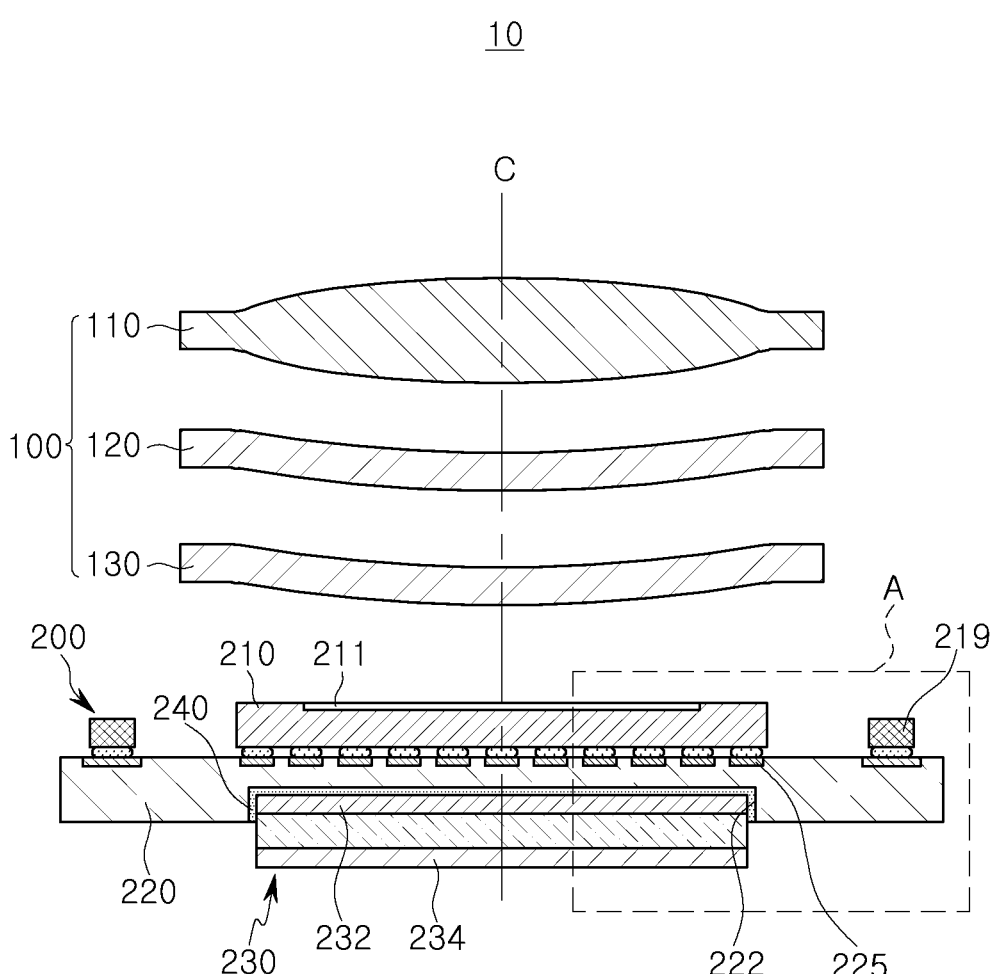
FIG. 1 illustrates a cross-sectional diagram of an example camera module, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Figure 2:
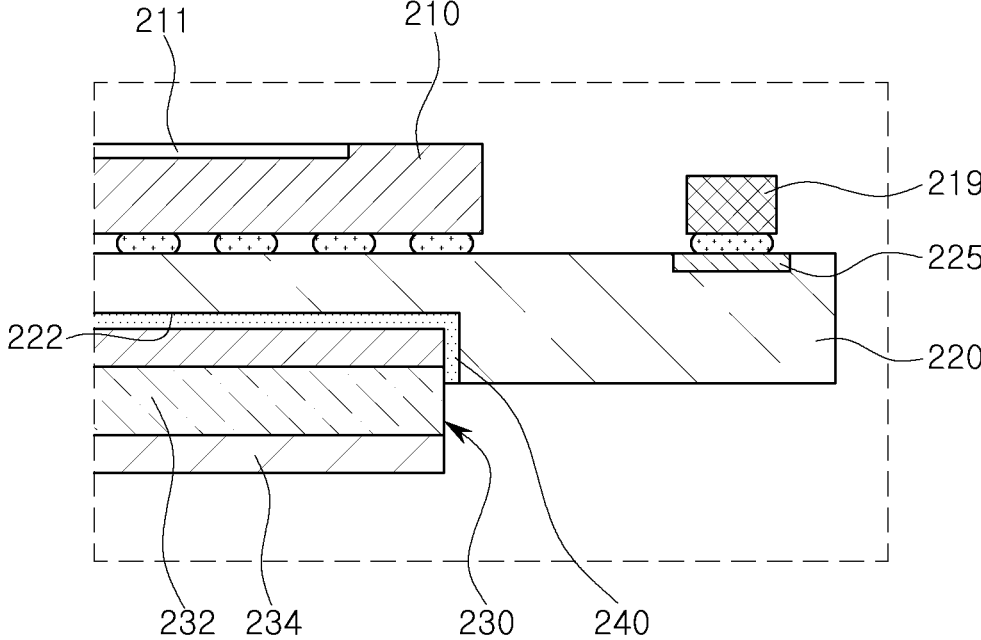
FIG. 2 illustrates an enlarged cross-sectional diagram of a portion A in FIG. 1.
Figure 3:
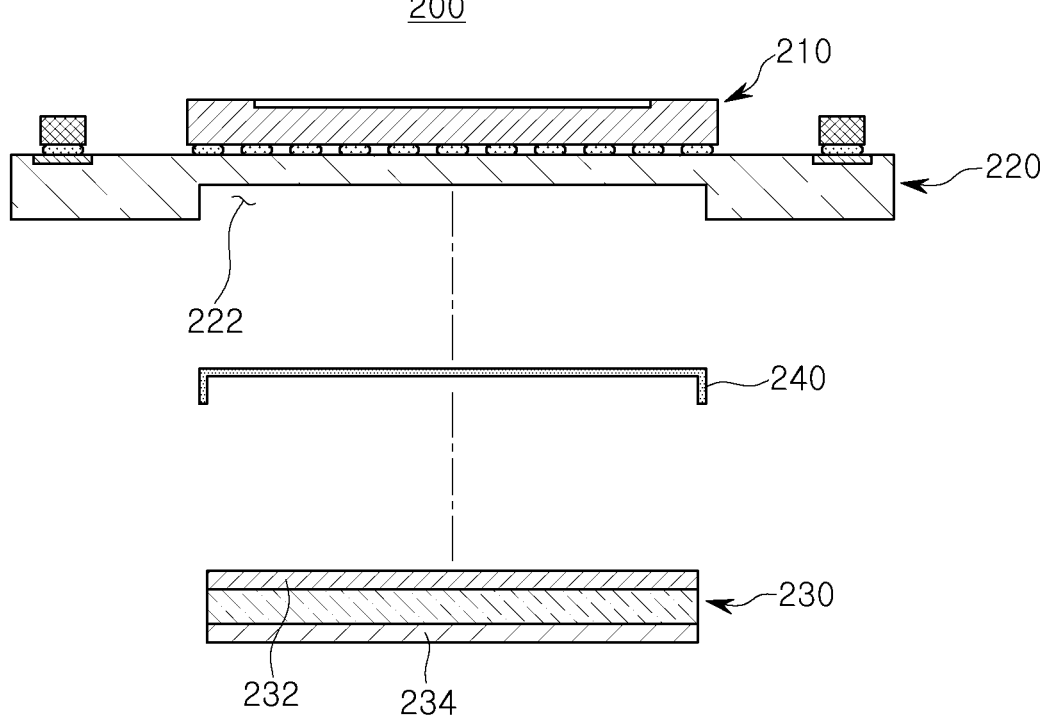
FIG. 3 illustrates an exploded diagram of the example image sensor package illustrated in FIG. 1.

FIG. 1 illustrates a cross-sectional diagram of an example camera module according to an example. FIG. 2 illustrates an enlarged cross-sectional diagram illustrating portion A in FIG. 1. FIG. 3 is an exploded diagram illustrating the image sensor package illustrated in FIG. 1.

Referring to FIGS. 1 to 3, an example camera module 10, in accordance with one or more embodiments, may include an optical imaging system 100 and an image sensor package 200.

The optical imaging system 100 may include one or more lenses. In an example, the optical imaging system 100 in an example may include a first lens 110, a second lens 120, and a third lens 130. However, the number of lenses included in the optical imaging system 100 may not be limited to three. In an example, the optical imaging system 100 may include two or less lenses or four or more lenses.

The optical imaging system 100 may further include a filter (not illustrated) to block infrared rays. In an example, the filter may be disposed between a rearmost lens (for example, the third lens 130) and the image sensor package 200.

In the optical imaging system 100, an image sensor 210 may be disposed at a focal point. Accordingly, the image sensor package 200 may be disposed in a rear region of the optical imaging system 100 with respect to an incident path C of light.

The image sensor package 200 may include an image sensor 210, a substrate 220, and a heat dissipation element 230.

The image sensor 210 may be provided in the form of an electronic device, and may convert an optical signal incident through the optical imaging system 100 into an electrical signal. An electrical signal converted by the image sensor 210 may be output as an image through a display of a mobile electronic device.

In a non-limited example, the image sensor 210 in the example may be implemented as a charge coupled device (CCD) or a complementary metal-oxide semiconductor (CMOS), and may be electrically connected to the substrate 220.

One or more electronic devices 219 may be mounted on the substrate 220. The one or more electronic devices 219 may include the image sensor 210.

The substrate 220 in the example may be formed of a rigid circuit board (PCB) including a prepreg, or a flexible circuit board (FPCB) in which a wiring pattern is formed on an insulating film having flexibility. However, an example thereof is not limited thereto, and a substrate having a predetermined level of rigidity, such as a ceramic substrate or a glass substrate, in which circuit wiring is available, may be implemented as the substrate 220 in the example.

The substrate 220 may include connection pads 225 that may be physically and electrically connected to the image sensor 210 or the electronic device 219, and wiring (not illustrated) electrically connecting the connection pads 225 to each other. The wiring may be formed on or in the substrate 220.

The substrate 220 in the example may include a first surface and a second surface opposite to the first surface, and the image sensor 210 may be disposed on the first surface of the substrate 220. Accordingly, a portion of the connection pads 225 may be electrically connected to the image sensor 210.

In the example, the image sensor 210 may be mounted on the first surface of the substrate 220 by a flip chip bonding method. Accordingly, a first surface of the image sensor 210 may be used as a bonding surface with the substrate 220, and a second surface may be used as a sensing surface on which an effective imaging surface 211 that receives light and forms an image is disposed.

However, an example thereof is not limited thereto, and the image sensor 210 and the substrate 220 may be electrically connected to each other through a bonding wire as in an example.

A heat dissipation element 230 may be coupled to the second surface of the substrate 220. A receiving groove 222 may be provided in the second surface of the substrate 220.

The receiving groove 222 may be formed as a space in which at least a portion of the heat dissipation element 230 is accommodated. Accordingly, the receiving groove 222 may be formed to have a size and shape corresponding to the size or shape of the heat dissipation element 230.

At least a portion of the receiving groove 222 may be formed in a region opposing the image sensor 210. Accordingly, a shortest distance between the image sensor 210 and the heat dissipation element 230 may be shorter than a thickness of the substrate 220.

The heat dissipation element 230 may be coupled to the second surface of the substrate 220, and may emit heat generated from the image sensor 210. The heat dissipation element 230 in the example may include a thermoelectric element That cools or heats an object using heat absorption or heat emission due to the Peltier effect. Accordingly, the heat dissipation element 230 in the example may include a heat absorption portion 232 that absorbs heat from a contact surface, and a heat emission portion 234 that emits heat absorbed by the heat absorption portion 232.

The heat absorption portion 232 may be disposed on a first surface of the heat dissipation element 230, and the heat emission portion 234 may be disposed on a second surface of the heat dissipation element 230 opposite to the first surface.

The heat absorption portion 232 may be disposed to be in contact with the substrate 220 and may absorb heat transferred from the image sensor 210. Additionally, the entire heat emission portion 234 may be disposed externally of the receiving groove 222, and may emit heat transferred from the heat absorption portion 232.

At least a portion of the heat absorption portion 232 of the heat dissipation element 230 may be disposed in the receiving groove 222 of the substrate 220. In the example, the entire heat absorption portion 232 may be disposed in the receiving groove 222. Accordingly, a depth of the receiving groove 222 may be formed to be greater than a thickness of the heat absorption portion 232, and an area of the receiving groove 222 may be formed to be larger than an area of the heat absorption portion 232.

To firmly bond the heat dissipation element 230 to the substrate 220, a bonding member 240 may be interposed between the substrate 220 and the heat dissipation element 230.

The bonding member 240 may bond the heat dissipation element 230 to the substrate 220 and may transfer heat from the substrate 220 to the heat dissipation element 230. Accordingly, the bonding member 240 may be formed of a material having high thermal conductivity, and in an example, a bondable conductive material, such as solder, may be used.

In an example, the bonding member 240 may be filled in the internal space of the receiving groove 222 and may be applied to the entire internal surface of the receiving groove 222, or may be applied to the entire surface of the heat absorption portion 232 and may bond the heat absorption portion 232 to the substrate 220. However, the example is not limited thereto, and in an example, the bonding member 240 may be disposed only on a portion of the surface of the heat absorption portion 232.

In the example camera module 10 configured as described above, the heat absorption portion 232 of the heat dissipation element 230 may be embedded in the substrate 220. Additionally, the surface of the heat absorption portion 232 may be bonded to the substrate 220 through the bonding member 240. Accordingly, the heat absorption portion 232 in the example may be disposed to not be in contact with external air.

In view of this configuration, in the example camera module 10, condensation may be prevented in the image sensor package 200.

Since the example heat dissipation element 230 may be a thermoelectric element implementing the Peltier effect, the temperature of the heat absorption portion 232 may be rapidly lowered when the heat dissipation element 230 operates.

Condensation may be a phenomenon in which the temperature of the atmosphere including moisture falls below the dew point, and the moisture contained in the air condenses into water droplets on the surface of an object. When the heat absorption portion 232 is exposed to the air, it is highly likely that condensation may occur on the heat absorption portion 232 due to the low temperature.

When condensation occurs on the surface of the heat absorption portion 232 as above, water droplets may flow along the surface of the substrate 220, which may cause an electrical issue such as a short circuit in the image sensor package 200.

However, in the example camera module 10, since the entire heat absorption portion 232 is accommodated in the receiving groove 222 of the substrate 220, and the bonding member 240 is disposed on the surface of the heat absorption portion, the heat absorption portion 232 may not be exposed to the air. Accordingly, the contact between the heat absorption portion 232 and the atmosphere may be blocked by the bonding member 240, such that condensation on the surface of the heat absorption portion 232 may be prevented, and an electrical issue may be prevented in the image sensor package 200.

Additionally, since the heat dissipation element 230 is inserted to the receiving groove 222 in the example image sensor package 200, the distance between the image sensor 210 and the heat dissipation element 230 may be reduced. Accordingly, the heat dissipation path may be formed with the shortest distance, such that cooling efficiency of the image sensor 210 may increase.

The one or more examples are not limited to the aforementioned example, and various modifications may be made.

Figure 4:
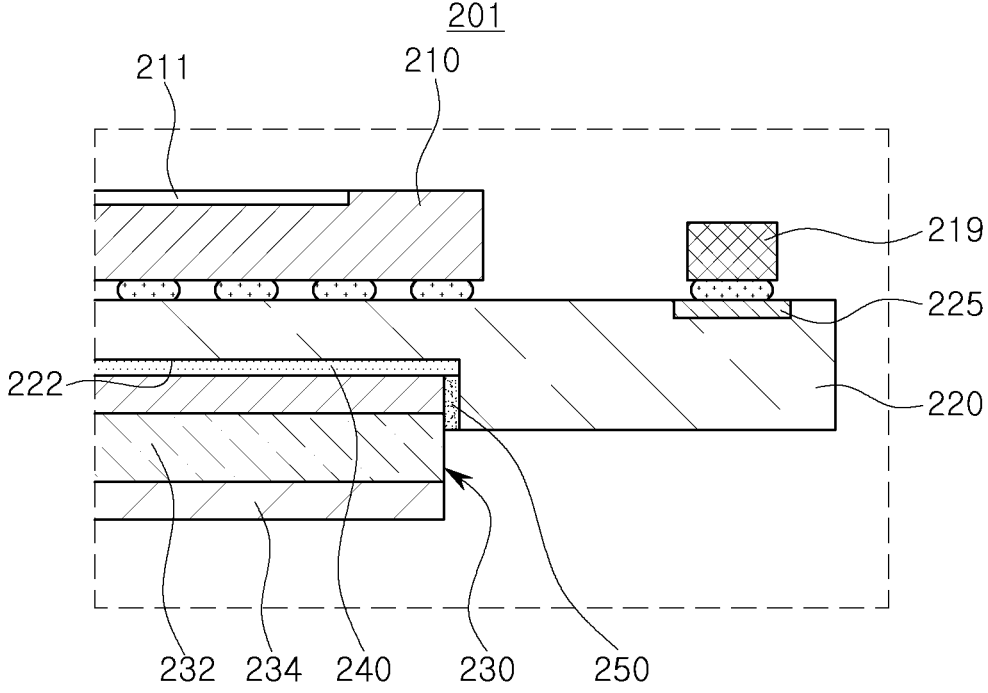
FIG. 4 illustrates a cross-sectional diagram of an example camera module, in accordance with one or more embodiments.

FIG. 4 illustrates a cross-sectional diagram of an example camera module, in accordance with one or more embodiments.

Referring to FIG. 4, in the example image sensor package 201, the bonding member 240 may be disposed only on a portion of the surface of the heat absorption portion 232. In the example, the bonding member 240 may be disposed only on an upper surface of the heat absorption portion 232. However, the examples are not limited thereto, and the bonding member 240 may be disposed on the entire side surface of the heat absorption portion 232 and the bonding member 240 may not be disposed on the upper surface of the heat absorption portion 232, such that the bonding member 240 may be selectively disposed in various portions if desired.

Additionally, in the example image sensor package 201, a thermally conductive material 250 such as, but not limited to, thermal grease or a thermal compound, may be disposed in a portion of the surface of the heat absorption portion 232 on which the bonding member 240 is not disposed. Accordingly, even when the bonding member 240 is not provided, the surface of the heat absorption portion 232 may not be exposed to air.

Figure 5:
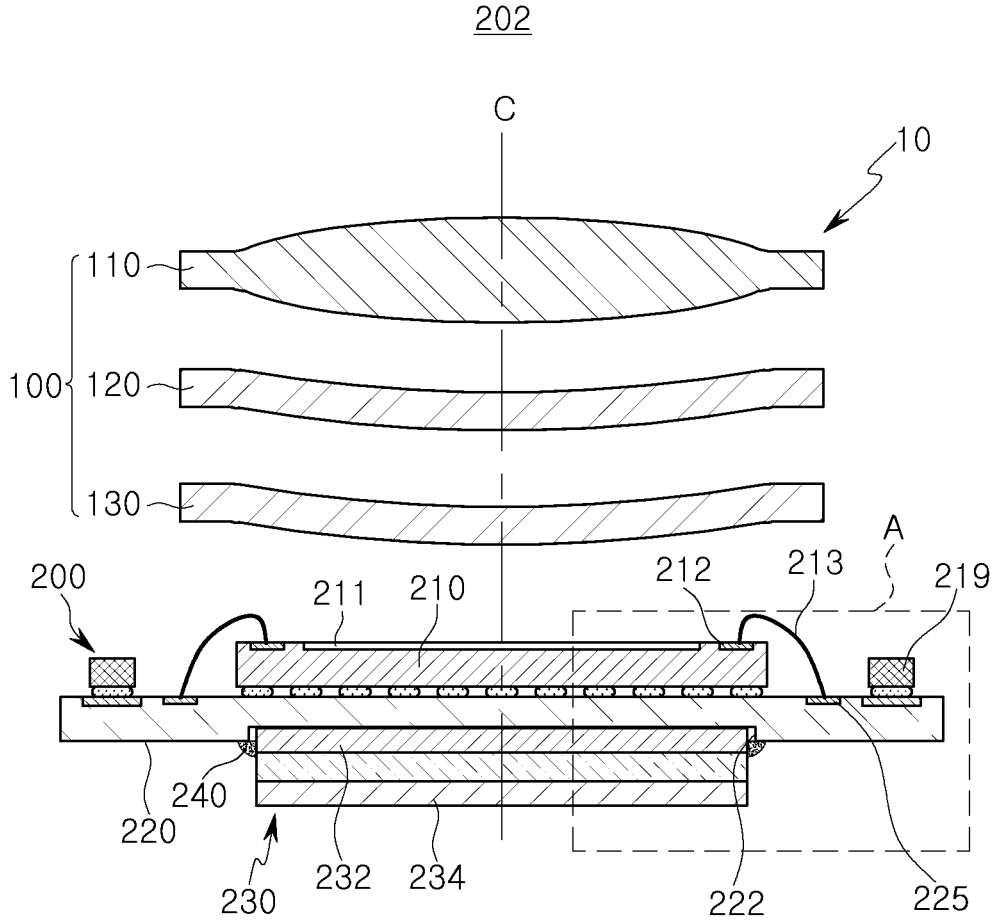
FIG. 5 illustrates a cross-sectional diagram of an example camera module, in accordance with one or more embodiments.
Figure 6:
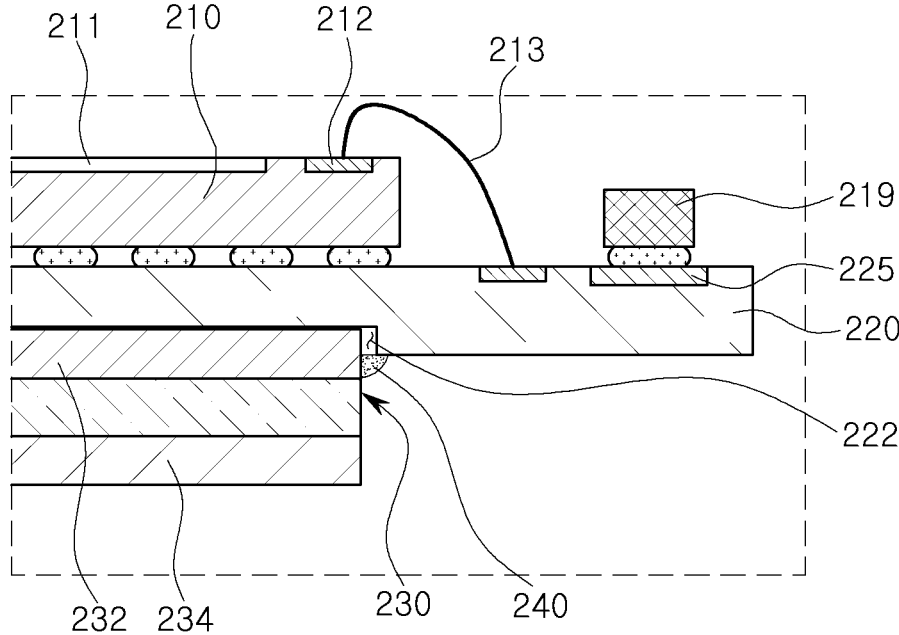
FIG. 6 illustrates an enlarged cross-sectional diagram of portion A in FIG. 5.

FIG. 5 illustrates a cross-sectional diagram of an example camera module, in accordance with one or more embodiments. FIG. 6 illustrates an enlarged cross-sectional diagram illustrating portion A in FIG. 5.

Referring to FIGS. 5 and 6, in the example image sensor package 202, the image sensor 210 may be electrically connected to the substrate 220 through the bonding wire 213.

In the example image sensor 210, a bonding pad 212 may be provided on an external side of the effective imaging surface 211 that receives light and forms an image. Additionally, the bonding wire 213 may have a first end bonded to the bonding pad 212 and a second end bonded to the bonding pad 225 of the substrate 220 and may electrically connect the image sensor 210 to the substrate 220.

Additionally, in the example image sensor package 202, at least a portion of the heat absorption portion 232 may be disposed externally of the receiving groove 222. Additionally, the bonding member 240 may be bonded to the surface of the heat absorption portion 232 exposed externally of the receiving groove 222. In an example, the bonding member 240 may be disposed externally of the receiving groove 222, not in the receiving groove 222, and may be applied along a side surface of the heat dissipation element 230.

The bonding member 240 may be disposed to cover the entire side surface of the heat dissipation element 230 exposed externally of the receiving groove 222, and accordingly, the entire portion of the heat absorption portion 232 exposed externally of the receiving groove 222 may be embedded in the bonding member 240.

Additionally, the bonding member 240 may be bonded to the second surface of the substrate 220, and may bond the heat dissipation element 230 to the substrate 220. Accordingly, the internal space of the receiving groove 222 may be formed as a sealed space by the bonding member 240.

In the example, the bonding member 240 may be formed by applying an adhesive including an epoxy resin and curing the adhesive. However, the example is not limited thereto. In an example, the bonding member 240 may be formed with a conductive adhesive such as, but not limited to, solder. A connection pad may be formed on the substrate 220 along a region to which the bonding member 240 is bonded. The connection pad to which the bonding member 240 is bonded may be a dummy pad that is not electrically connected to the other connection pad 225.

Due to this configuration, in the example embodiment, the bonding member 240 may not be provided between the internal surface of the receiving groove 222 and the heat absorption portion 232, and accordingly, a distance between the internal surface of the receiving groove 222 and the heat absorption portion 232 may be formed as a void.

In the example image sensor package 200 configured as described above, even when a portion of the heat absorption portion 232 is exposed externally of the substrate 220, the heat absorption portion 232 may not be exposed to the air. Accordingly, condensation may be prevented on the surface of the heat absorption portion 232, thereby providing the effect as in the aforementioned example embodiment.

Figure 7:
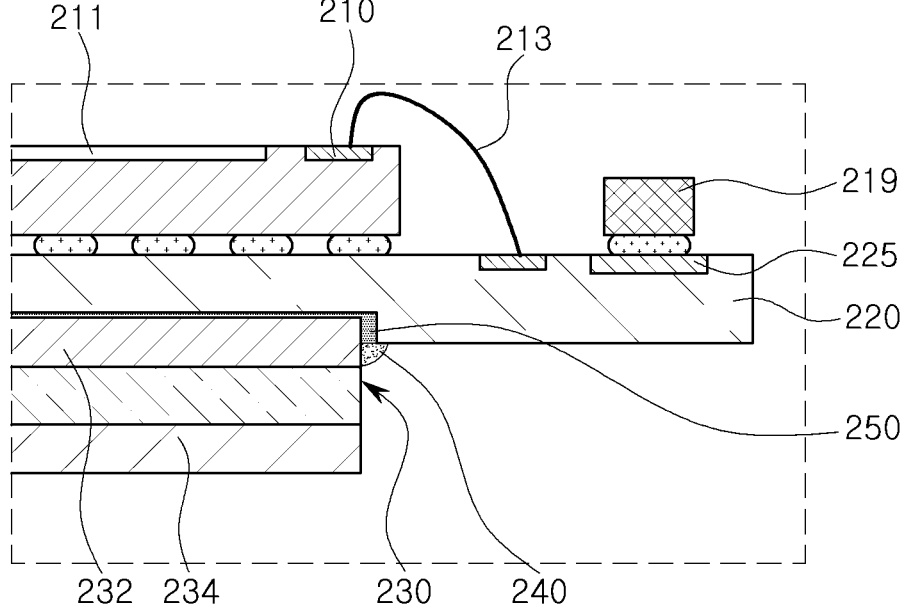
FIG. 7 illustrates a cross-sectional diagram of an example camera module, in accordance with one or more embodiments.

FIG. 7 illustrates a cross-sectional diagram of an example camera module, in accordance with one or more embodiments, illustrating a cross-sectional diagram corresponding to FIG. 6.

Referring to FIG. 7, in the example image sensor package 203, a thermally conductive material 250 may be disposed in a gap between the heat absorption portion 232 and the substrate 220, which may be the internal space of the receiving groove 222. In the example, the thermally conductive material 250 may be disposed in the entire gap between the heat absorption portion 232 and the substrate 220. However, the examples are not limited thereto, and the thermally conductive material 250 may be disposed on one of the side surface or the upper surface of the heat absorption portion 232, and the thermally conductive material 250 may be selectively disposed on various portions if desired.

The thermally conductive material 250 may include thermal grease or a thermal compound, but the examples are not limited thereto.

The substrate and the heat dissipation element in the example may be applied to electronic devices other than the image sensor. Therefore, the example embodiment is not limited to a camera module, and may be applied to a package on which the heat dissipation element is mounted on the substrate in various manners.

Additionally, the example image sensor package may be variously modified in a manner in which the surface of the heat absorption portion is not exposed to air. In an example, the example image sensor package may be configured to include both the bonding member illustrated in FIG. 2 and the bonding member illustrated in FIG. 5.

According to the aforementioned example embodiments, an electrical issue, such as a short circuit, caused by condensation may be prevented in the image sensor package.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. An image sensor package, comprising:
an image sensor;

a substrate comprising the image sensor disposed on a first surface of the substrate, and a receiving groove disposed in a second surface of the substrate; and a heat dissipation element comprising a heat absorption portion configured to absorb heat dissipating from a contact surface, and a heat emission portion configured to emit heat absorbed by the heat absorption portion, wherein, the first surface of the substrate and the second surface of the substrate face each other in an optical axis direction, wherein, in the heat dissipation element, the heat absorption portion is spaced apart from the image sensor and is disposed in the second surface of the substrate, wherein, in the heat dissipation element, at least a portion of the heat absorption portion is accommodated in the receiving groove and coupled to the substrate, wherein the heat absorption portion is disposed on a first surface of the heat dissipation element, and the heat emission portion is disposed on a second surface of the heat dissipation element, and wherein the heat emission portion is entirely disposed externally of the receiving groove.

2. The image sensor package of claim 1, wherein the heat dissipation element is coupled to the second surface of the substrate.

3. The image sensor package of claim 1, further comprising:

a bonding member interposed between the substrate and the heat absorption portion and configured to bond the substrate to the heat absorption portion.

4. The image sensor package of claim 3, wherein the bonding member is formed of a conductive material.

5. The image sensor package of claim 3, wherein the bonding member is disposed on an entire surface of the heat absorption portion.

6. The image sensor package of claim 1, further comprising:

a bonding member disposed along a side surface of the heat dissipation element externally of the receiving groove, and configured to bond the heat dissipation element to the substrate.

7. The image sensor package of claim 6, wherein the bonding member is disposed to cover an entire surface of the heat absorption portion exposed externally of the receiving groove.

8. The image sensor package of claim 6, wherein the bonding member is formed of an adhesive including an epoxy resin.

9. The image sensor package of claim 6, wherein the bonding member is configured to seal an internal space of the receiving groove.

10. The image sensor package of claim 9, further comprising:

a thermally conductive material that is filled in an internal space of the receiving groove.

11. The image sensor package of claim 1, wherein at least a portion of the receiving groove is formed in a region opposing the image sensor.

12. The image sensor package of claim 1, wherein a shortest distance between the image sensor and the heat dissipation element is disposed to be shorter than a thickness of the substrate.

13. The image sensor package of claim 1, wherein an entire side surface of the heat absorption portion is bonded to an internal surface of the receiving groove.

14. An image sensor package, comprising:

a substrate comprising an image sensor disposed on a first surface of the substrate and a receiving groove disposed in a second surface of the substrate;

a heat dissipation element inserted into the receiving groove; and a bonding member configured to bond the heat dissipation element to the substrate, wherein the heat dissipation element comprises a heat absorption portion configured to absorb heat from a contact surface, and a heat emission portion configured to emit heat absorbed by the heat absorption portion, and wherein contact between the heat absorption portion and air is blocked by the bonding member.

15. The image sensor package of claim 14, wherein the bonding member is filed in an internal space of the receiving groove.

16. The image sensor package of claim 14, wherein the bonding member is configured to seal an internal space of the receiving groove.

* * * * *